United States Patent
Horstmann et al.

(10) Patent No.: US 6,798,028 B2
(45) Date of Patent: Sep. 28, 2004

(54) FIELD EFFECT TRANSISTOR WITH REDUCED GATE DELAY AND METHOD OF FABRICATING THE SAME

(75) Inventors: Manfred Horstmann, Dresden (DE); Rolf Stephan, Dresden (DE); Karsten Wieczorek, Boxdorf (DE); Stephan Kruegel, Boxdorf-Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 93 days.

(21) Appl. No.: 09/847,622

(22) Filed: May 2, 2001

(65) Prior Publication Data

US 2002/0056859 A1 May 16, 2002

(30) Foreign Application Priority Data

Nov. 16, 2000 (DE) .......................................... 100 56 873

(51) Int. Cl.[7] .................... H01L 29/76; H01L 29/94; H01L 31/062; H01L 31/113; H01L 31/119
(52) U.S. Cl. .................... 257/412; 257/407; 257/413
(58) Field of Search .................... 257/336, 344, 257/346, 366, 382, 384, 387, 388, 412, 413

(56) References Cited

U.S. PATENT DOCUMENTS

| | | | | | |
|---|---|---|---|---|---|
| 4,714,519 | A | * | 12/1987 | Pfiester ........................ 438/304 |
| 5,144,393 | A | * | 9/1992 | Yamaguchi et al. ........ 359/23.9 |
| 5,371,387 | A | * | 12/1994 | Sato ............................. 257/387 |
| 5,391,905 | A | * | 2/1995 | Yamazaki .................... 257/370 |
| 5,614,739 | A | * | 3/1997 | Abrokwah et al. .......... 257/192 |
| 5,621,236 | A | * | 4/1997 | Choi et al. ................... 257/389 |
| 5,623,153 | A | * | 4/1997 | Liang et al. ................. 257/336 |
| 5,693,549 | A | * | 12/1997 | Kim ............................. 437/41 |
| 5,851,890 | A | * | 12/1998 | Tsai et al. .................... 438/303 |
| 5,998,273 | A | | 12/1999 | Ma et al. ..................... 438/305 |
| 5,998,285 | A | | 12/1999 | Chou ........................... 438/585 |
| 6,037,630 | A | * | 3/2000 | Igarashi et al. ............. 257/336 |
| 6,046,105 | A | | 4/2000 | Kittl et al. ................... 438/655 |
| 6,060,749 | A | * | 5/2000 | Wu ............................... 257/347 |
| 6,097,070 | A | * | 8/2000 | Mandelman et al. ....... 257/389 |
| 6,306,715 | B1 | * | 10/2001 | Chan et al. .................. 438/301 |
| 6,335,214 | B1 | * | 1/2002 | Fung ............................ 438/30 |
| 6,507,078 | B1 | * | 1/2003 | Yu ................................ 257/388 |
| 6,630,712 | B2 | * | 10/2003 | Yu ................................ 257/344 |

FOREIGN PATENT DOCUMENTS

WO 97/23902 7/1997 ........... H01L/21/28

OTHER PUBLICATIONS

International Search Report dated July 29, 2002 for International application No. PCT/US01/49970 Filed Oct. 23, 2001.

* cited by examiner

Primary Examiner—Tom Thomas
Assistant Examiner—Jesse A. Fenty
(74) Attorney, Agent, or Firm—Williams, Morgan & Amerson, P.C.

(57) ABSTRACT

A transistor formed on a substrate comprises a gate electrode having a lateral extension at the foot of the gate electrode that is less than the average lateral extension of the gate electrode. The increased cross-section of the gate electrode compared to the rectangular cross-sectional shape of a prior art device provides for a significantly reduced gate resistance while the effective gate length, i.e., the lateral extension of the gate electrode at its foot, may be scaled down to a size of 100 nm and beyond. Moreover, a method for forming the field effect transistor described above is disclosed.

23 Claims, 5 Drawing Sheets

FIELD EFFECT TRANSISTOR WITH REDUCED GATE DELAY AND METHOD OF FABRICATING THE SAME

BACKGROUND OF THE INVENTION

1. Field of the Invention

The present invention relates to field effect transistors and integrated circuits and, particularly, to a field effect transistor (FET) having a gate electrode with a reduced gate resistance and a method for fabricating the same.

2. Description of the Related Art

The manufacturing process of integrated circuits (ICs) involves the fabrication of numerous semiconductor devices, such as insulated gate field effect transistors, on a single substrate. In order to provide increased integration density and an improved device performance of the field effect transistors, for instance, with respect to signal processing time and power consumption, feature sizes of the field effect transistors are steadily decreasing. In general, decreasing feature sizes, such as the gate length of the field effect transistor, provide a variety of advantages, for example, high package density and small rise and fall times during switching of the transistors due to the reduced gate length and, hence, the reduced channel length. Reducing the gate length of the FET beyond a certain size, however, may result in disadvantages that act to offset advantages obtained by the reduced channel length, e.g., the resistance of the gate electrode having the reduced gate length increases with decreasing gate length. As a result, a delay of the voltage applied to the gate electrode for controlling the channel can be observed. Especially in modern ultrahigh density circuits, the gate length is trimmed down to 100 nm or less, so that the available gate cross-section for transmitting the voltage applied to the gate electrode is not sufficient to insure the high-speed signal transmission required for obtaining the fast switching times of modern integrated circuits, such as microprocessors driven by clock frequencies of 1 GHz and more.

To clearly demonstrate the problems involved with steadily decreasing feature sizes of modern ultra-high density integrated circuits, a typical prior art process flow will be described with reference to FIGS. 1a–1d, in which the problems involved with the formation of the gate electrode are detailed. As the skilled person will easily appreciate, the figures depicting the typical prior art process flow and the typical prior art device are merely of a schematic nature, and transitions and boundaries illustrated as sharp lines may not be imparted as sharp transitions in a real device. Furthermore, the description of the typical prior art process and device refers to standard manufacturing procedures without specifying typical process parameter values used for these procedures, since individual processing steps may be accordingly adapted to meet specific design requirements. Moreover, only the relevant steps and features of the transistor device are shown in the figures.

In FIG. 1a, a schematic cross-sectional view of a field effect transistor manufactured in accordance with a typical CMOS processing is illustrated. In FIG. 1a, a field effect transistor 100 is schematically shown in a manufacturing stage prior to patterning a gate electrode. In a silicon substrate 101, shallow trench-isolations 102 define an active region 106. A gate insulation layer 103 separates a polysilicon layer 104 from the active region 106. On the polysilicon layer 104, a photoresist layer 105 is patterned.

The formation of the structure shown in FIG. 1a may be accomplished using the following process steps. After defining the active region 106 by forming the shallow trench isolations 102, the gate insulation layer 103 is thermally grown on the substrate. Thereafter, a polycrystalline silicon (polysilicon) layer 104 is deposited over the gate insulation layer 103. Then, a photoresist layer is deposited on the polysilicon layer 104, and it is patterned by photolithography using deep ultraviolet exposure light to result in the patterned photoresist layer 105.

FIG. 1b schematically shows a cross-sectional view of the field effect transistor 100 of FIG. 1a in an advanced manufacturing stage. In FIG. 1b, a gate electrode 107 is formed over the active region 106, and it is separated therefrom by the gate insulation layer 103. The gate electrode 107 has been formed from the polysilicon layer 104 by anisotropic etching using the photoresist layer 105 as a mask. A lateral extension of the gate electrode 107 in a transistor length dimension, indicated by the arrows 108 and 109 and also referred to as the gate length, is determined by the lithography step and by a subsequent etch trim process performed to further reduce the gate length. A gate height, indicated by arrow 110, is determined by the thickness of the polysilicon layer 104. According to this typical prior art processing, the gate length on the top 120 of the gate electrode 107, as indicated by arrow 109, is essentially equal to the gate length at the foot or bottom 141 of the gate electrode 107, represented by arrow 108.

As can be seen from FIG. 1b, the cross-section of the gate electrode 107 is of substantially rectangular shape and the effective cross-section available for charge carrier transportation decreases, as the gate length is scaled down. Moreover, the gate voltage for controlling the channel to be formed in the active region 106 is applied by contact portions that are outside of the active region in the transistor width dimension, which is the dimension extending along a line normal to the drawing plane of FIG. 1b. Accordingly, the effective sheet resistance of the gate electrode depends on the gate length on the top portion 120 of the gate electrode 107, and, more particularly, the gate sheet resistance increases as the gate length decreases.

FIG. 1c schematically shows a cross-section of the final field effect transistor 100. In the active region 106, drain and source regions 111 are formed and separated in the transistor length dimension by a channel 114. Sidewall spacers 112 are formed on the sidewalls of the gate electrode 107 and extend along the transistor width dimension. At the top surfaces of the drain region, the source region and the gate electrode, portions 113 of materials having a reduced electrical resistance, for example, consisting of cobalt silicide, are formed.

The portion 113 of reduced electrical resistance above the gate electrode 107 is also of substantially rectangular shape and, therefore, exhibits a gate area available for charge carrier transportation, i.e., cross-section that is small, particularly when the gate length is trimmed down to dimensions of 100 nm and beyond. Since the thickness of the polysilicon layer 104 and, hence, the height of the gate electrode 107, is limited to about 1500–2000 Å with respect to stability of the gate electrode, polysilicon delamination and the like, the transistor 100 suffers from higher gate resistance when the gate length is reduced, thereby significantly deteriorating the performance of the transistor.

In view of the above problems, a need exists for a field effect transistor device having a reduced gate resistance, and for a method for fabricating the gate electrode with reduced gate resistance.

SUMMARY OF THE INVENTION

According to one aspect of the present invention, a transistor comprises a substrate, an active region defined in the substrate, a gate insulation layer formed above the active region, and a gate electrode formed above the gate insulation layer. The gate electrode comprises a middle portion located over the active region, wherein the middle portion has a gate length and a gate height. A cross-sectional area in a plane defined by the gate length and the gate height of the middle portion exceeds a value obtained by multiplying the gate length by the gate height.

As is common practice, the gate length is herein defined as the lateral extension at the bottom of the middle portion of the gate electrode. The middle portion indicates that part of the gate electrode is located over the channel region for controlling the conductivity of the channel. The gate height is defined as the extension of the gate electrode perpendicular to the surface of the active region on which the gate insulation layer is formed. Thus, according to the present invention, the gate electrode comprises a middle portion that may be scaled down to meet the design requirements such that a reduced channel length can be realized, wherein the cross-sectional area is increased compared to a typical prior art device having a substantially rectangular cross-sectional area. As a consequence, the effective gate resistance is decreased and the device performance with respect to, for example, signal delay, is significantly improved.

In accordance with a further embodiment of the present invention, a lower part of the middle portion may be formed such that its lateral extension, i.e., its length dimension, along the gate height dimension is substantially uniform, that is the cross-section is substantially rectangular, and the lateral extension substantially coincides with the gate length. Thus, a "step-like" transition from the lower part to an upper part of the middle portion of the gate electrode is provided. The lateral extension of the upper part of the gate electrode at this transition is significantly larger than the gate length. This "T-shaped" cross-section of the middle portion of the gate electrode provides an increased cross-section area and, thus, the effective gate resistance is significantly reduced. Moreover, due to the present invention, the top surface of the gate electrode is also increased and results in a decreased gate sheet resistance of the gate electrode, which also contributes to an improved signal transmission of the gate electrode. Furthermore, due to an increased surface area, a portion of reduced electrical resistance, for example, comprising a metal, is also increased and, hence, the effective electrical resistance of the gate electrode is further decreased, regardless of the gate length.

According to another aspect of the present invention, a method of manufacturing a field effect transistor having an improved signal performance is provided. The method comprises providing a substrate and forming an active region thereon, forming a gate insulation layer over the active region, and depositing a first gate electrode material having a first thickness and patterning a first portion of a gate electrode, wherein the first portion has a height substantially equal to the first thickness. The method further comprises depositing an insulating layer having a thickness determined by the first thickness, planarizing the insulating layer to expose a surface of the first portion, selectively removing material of the planarized insulating layer so as to reduce the thickness of the insulating layer until a predefined adjustment thickness is obtained to partially expose the sidewalls of the first portion, depositing a second gate electrode material layer over the insulating layer and the first portion, and anisotropically etching the second gate electrode material layer to form a gate electrode including the first portion and an extension portion laterally extending beyond the first portion, wherein a cross-sectional shape of the extension portion is determined by the adjustment thickness.

According to the method of the present invention, the gate electrode is formed in two steps, wherein the first step determines the final gate length of the transistor and the second step provides for the extension portion to significantly increase the cross-section of the gate electrode. Moreover, the method allows defining a cross-sectional shape of the gate electrode by adjusting the thickness of the insulating layer so that the resulting cross-sectional area of the gate electrode can be reliably and reproducibly obtained, since the deposition and etching processes involved in forming and patterning the insulating layer are well-controllable.

In accordance with further embodiments of the present invention, the process of selectively removing material of the insulating layer comprises using a slow chemical etch solution that is highly selective with respect to the first gate electrode material layer. Alternatively, selectively removing the insulating layer may comprise forming one or more etch stop layers on the first portion prior to the deposition of the insulating layer. Hence, the method can easily be implemented into a standard process flow so as to guarantee efficiency and cost-effectiveness of the manufacturing process. Moreover, according to the present invention, the gate electrode having an extension portion with increased lateral extension does not require any additional cost-intensive photolithography and, hence, does not require any additional aligning steps. This characteristic is also referred to as a "self-aligned" process.

Further advantages and objects of the present invention will become more apparent from the following detailed description and the appended claims.

BRIEF DESCRIPTION OF THE DRAWINGS

The invention may be understood by reference to the following description taken in conjunction with the accompanying drawings, in which like reference numerals identify like elements, and in which.

Figure 1A:
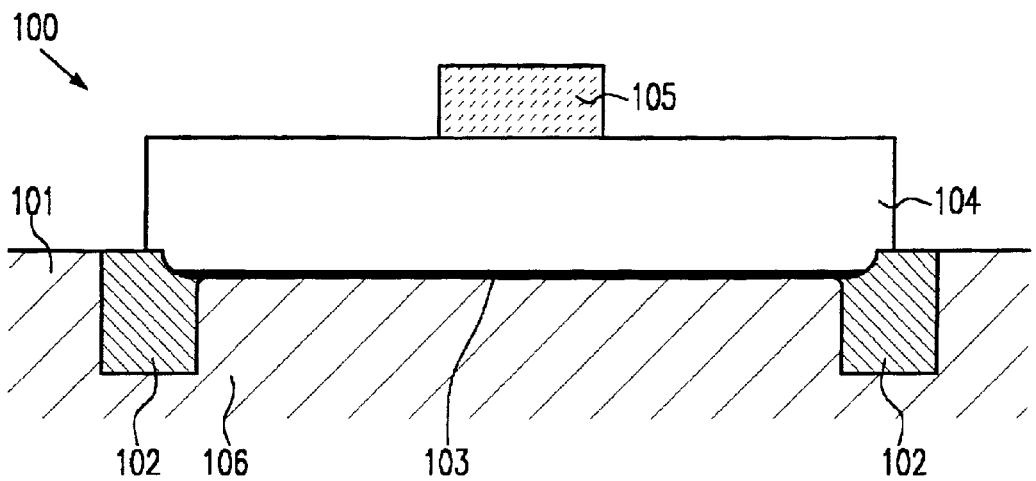
FIG. 1a shows a schematic cross-section of a typical prior art field effect transistor at an initial manufacturing stage.
Figure 1B:
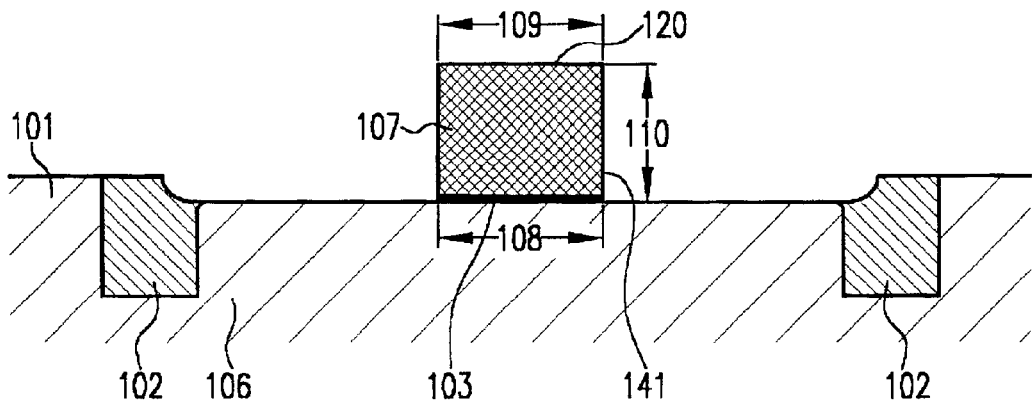
FIG. 1b shows a schematic cross-sectional view of the device of FIG. a with a substantially rectangular polycrystalline gate electrode.
Figure 1C:
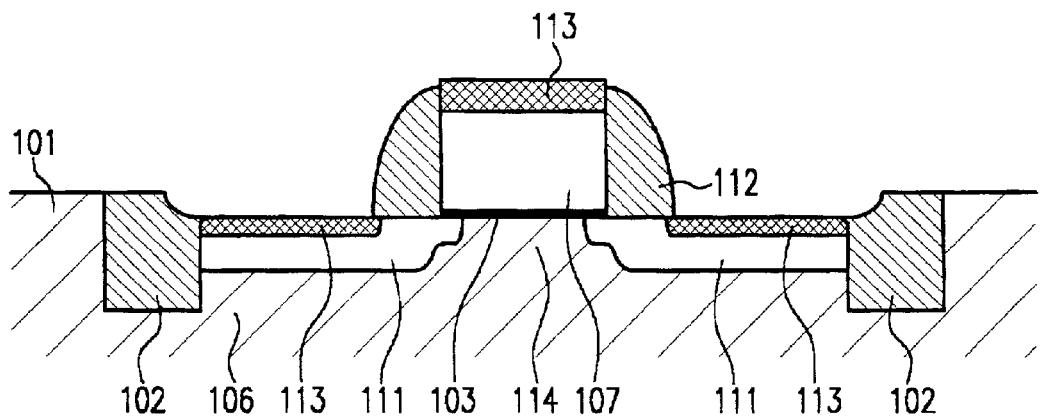
FIG. 1c schematically shows a cross-section of the final transistor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
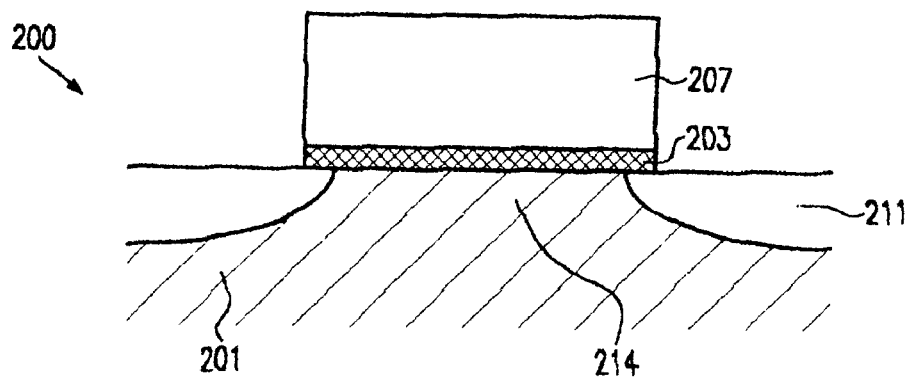
FIG. 2a schematically shows a cross-section of a portion of a field effect transistor at an early manufacturing stage in accordance with the present invention.

FIG. 2a shows a schematic cross-sectional view of a field effect transistor 200 at an early manufacturing stage in accordance with one embodiment of the present invention. In FIG. 2a, a gate insulation layer 203 and a first portion 207 of a gate electrode are formed above a substrate 201, which may be a semiconductor substrate such as silicon. As previously mentioned, only the middle portion of the gate electrode that is relevant for controlling a channel is depicted in the figures. Thereafter, lightly doped drain and source regions 211 are formed. The lightly doped drain and source regions 211 are spaced apart from each other with respect to the transistor length dimension, defined as the horizontal direction in FIG. 2a, by a channel region 214. The first portion 207 of a gate electrode to be formed is located above the channel region 214 and it is electrically insulated therefrom by the gate insulation layer 203.

Formation of the structure depicted in FIG. 2a may be accomplished by depositing and patterning both the gate insulation layer 203 and the layer from which a first portion 207 of a gate electrode will be formed using known photo-lithography and etching techniques. The first portion 207 is comprised of a first gate electrode material, which is, in one illustrative embodiment, a polycrystalline silicon (polysilicon) layer of a thickness of 1 µm to 2.5 µm. After formation of the first portion 207, the lightly doped drain and source regions 211 are formed by means of ion implantation and a subsequent rapid thermal annealing cycle.

Figure 2B:
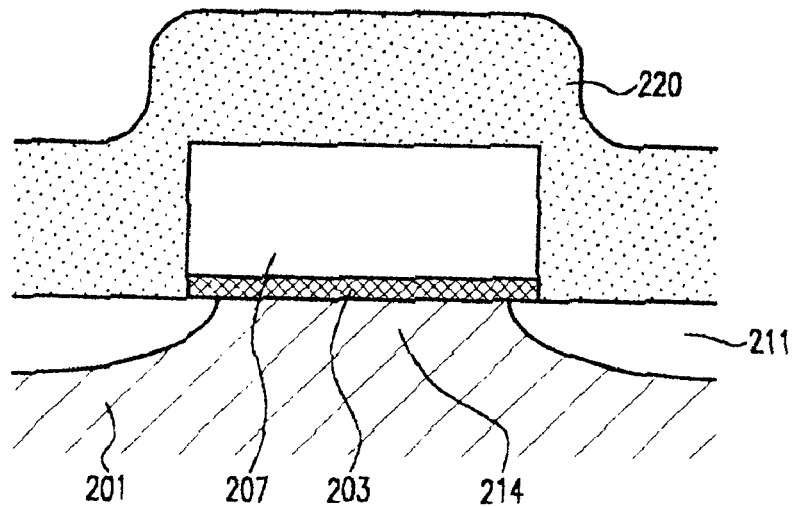
FIGS. 2b–2h show schematic cross-sectional views of the field effect transistor of FIG. 2a in an advanced manufacturing stage.

FIG. 2b schematically shows a cross-sectional view of the field effect transistor 200 in an advanced manufacturing stage. FIG. 2b shows the structure depicted in FIG. 2a with an insulating layer 220 that is deposited by chemical vapor deposition (CVD) over the first portion 207 and the lightly doped drain and source regions 211. In one embodiment, the thickness of the insulating layer 220 is adjusted so as to match approximately the thickness of the first portion 207, although this is not required. In one illustrative example, the thickness of the insulating layer 220 is adjusted to allow the planarization of the structure by means of CMP. Usually, the thickness would exceed or at least match the thickness of the first portion 207. The thickness of the insulating layer 220 depends, for example, on the tool set and the slurry used at the subsequent CMP step. An appropriate thickness of the insulating layer for the subsequent CMP process can easily be determined by those skilled in the art. The insulating layer 220 may preferably be comprised of silicon dioxide or silicon nitride, but any other appropriate dielectric material may be employed.

Figure 2C:
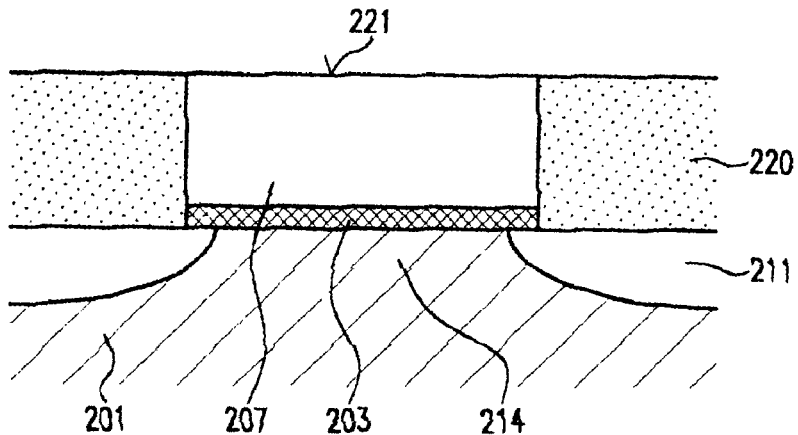

FIG. 2c schematically shows a cross-section of the field effect transistor 200 in a further advanced manufacturing stage. In FIG. 2c, the surface of the structure is planarized so as to expose a top surface 221 of the first portion 207. Planarizing of the surface is accomplished by a chemical mechanical polishing (CMP) step.

Figure 2D:
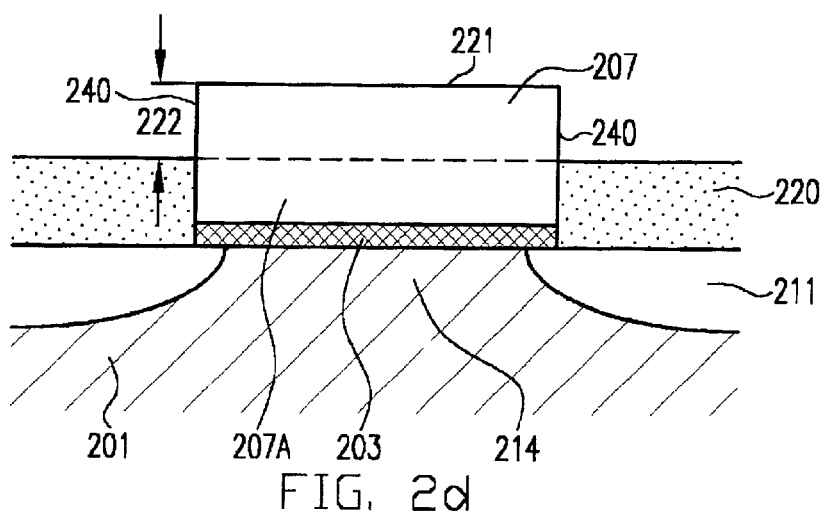

FIG. 2d schematically shows a cross-sectional view of the field effect transistor 200, wherein the thickness of the insulating layer 220 is decreased. Accordingly, a portion of the sidewalls 240 of the first portion 207 is exposed to a predefined degree as indicated by arrow 222. Reducing the thickness of insulating layer 220 may be accomplished by a chemical etch step that exhibits a high selectivity between the material of the insulating material 220 and the first gate electrode material used to form the first portion 207. By "high selectivity" it is meant that the etch rate of the insulating layer 220 is significantly higher than the etch rate of the first gate electrode material. The final thickness of the insulating layer 220 and, hence, the height of the unexposed surfaces of the sidewalls 240 of the first portion 207 defines the cross-sectional shape of a bottom portion 207A of a final gate electrode 242 (see FIG. 2f) to be formed. The bottom portion 207A is approximately defined by the dashed lines indicated in FIG. 2d. The thickness of the insulating layer 220 may be controlled by, for example, a highly selective, very slow chemical etch solution which is well known in the art. Further methods for controlling the final thickness of the insulator layer 220 will be described below with reference to FIGS. 3a–3c.

Figure 2E:
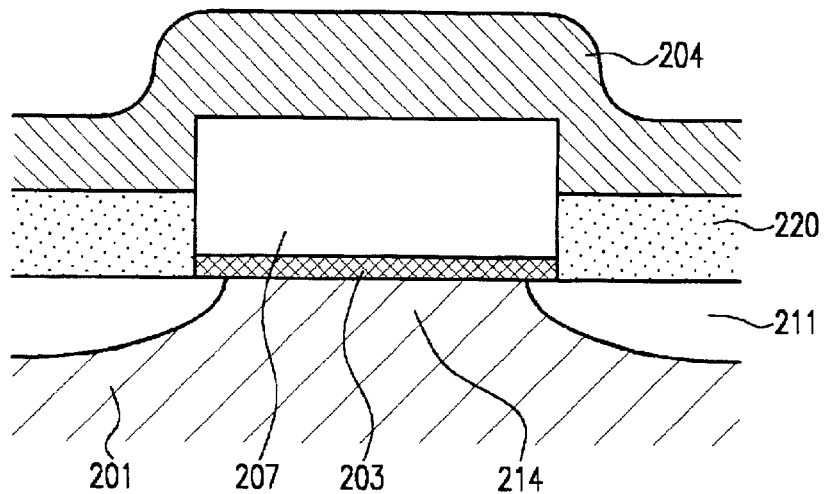

FIG. 2e schematically shows a cross-sectional view of the field effect transistor 200 in a further advanced manufacturing stage. Further to the structure depicted in FIG. 2d, a layer of a second gate electrode material 204, such as polycrystalline silicon, is deposited over the first portion 207 and the insulating layer 220.

Figure 2F:
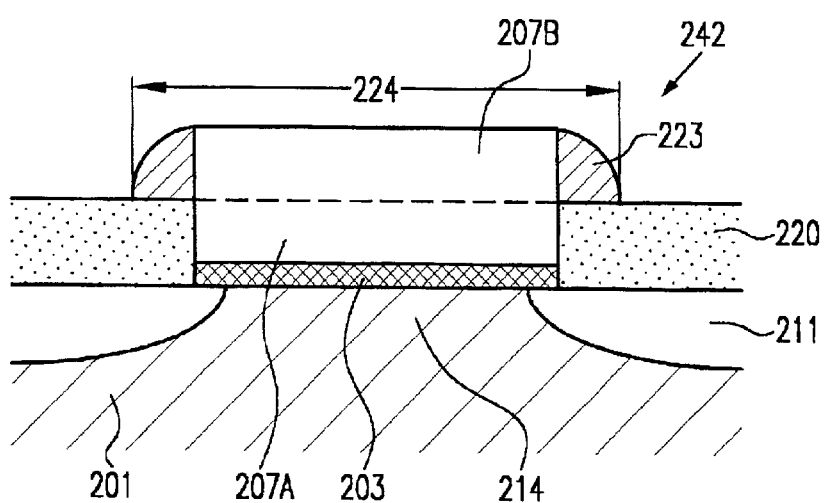

FIG. 2f schematically shows a cross-sectional view of the transistor device 200, which further comprises an extension portion 223 formed on the exposed surfaces of the sidewalls 240 of the first portion 207 so that a complete gate electrode 242 is obtained, wherein only the middle portion of the gate electrode 242 is shown without depicting the part of the gate electrode that is formed outside of the active region. The gate electrode 242 has an upper portion 207B having a lateral extension, indicated by arrow 224, that is larger than a lateral extension of the bottom portion 207A and the foot portion 241 of the gate electrode which approximately defines the gate length of the transistor device 200. The extension portions 223 are formed by an anisotropic etch step of the second gate electrode material 204, such as a reactive ion etching step known from standard sidewall spacer processing.

As can be seen from FIG. 2f, according to this embodiment, the bottom portion 207A of the gate electrode 242 has a substantially uniform lateral extension, i.e., a substantial uniform gate length, up to a height defined by the thickness of the insulating layer 220. Due to the extension portions 223, the lateral extension of the upper portion 207B of the completed gate electrode 242 has an average value along the height direction of the completed gate electrode 242 that is greater than the effective gate length of the lateral extension of the foot 241 of the bottom portion 207A. Accordingly, the effective cross-section of the completed gate electrode 242 is significantly increased compared to a standard prior art device and, hence, the gate resistance and, therefore, the propagation delay of a gate signal is remarkably reduced. In one illustrative embodiment, the lateral extension 224 of the upper portion 207B of the gate electrode ranges from approximately 400–2000 Å using current photolithographic technologies and techniques, assuming a gate length of the first portion 207, ranging from 350–1000 Å which is a typical value for advanced 0.1 µm to 0.18 µm technologies. Thus, in this illustrative embodiment, the lateral extension 224 of the upper portion 207B of the gate electrode 242 is approximately 5–100% greater than the lateral extension of the bottom portion 207B of the gate electrode 242.

Figure 2G:
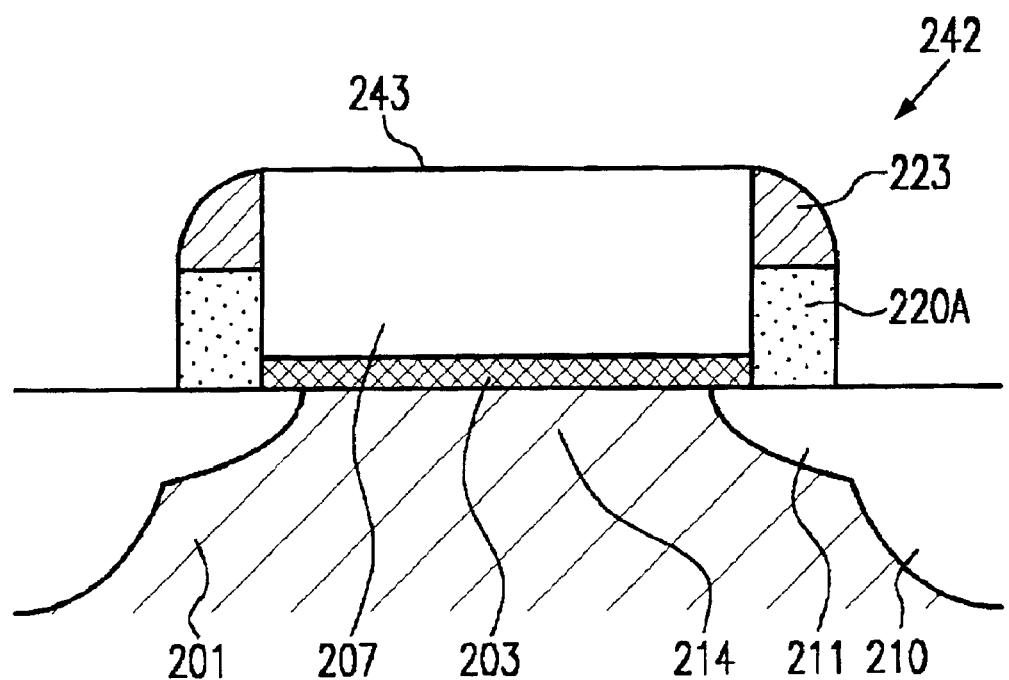

FIG. 2g schematically shows a cross-sectional view of the field effect transistor 200 in a further advanced manufacturing stage. Drain and source regions 210 are formed in the lightly doped drain and source regions 211 adjacent to the gate electrode 242 comprised of the upper portion 207B, including the extension portion 223, and the bottom portion 207A including insulating sidewall spacers 220A consisting of the residual insulating layer 220. That is, the sidewall spacers 220A are positioned between the extension portions 223 and the substrate 201. In order to obtain the structure shown in FIG. 2g, the insulating layer 220 is anisotropically etched and an ion implantation process is performed to create the drain and source regions 210.

Figure 2H:
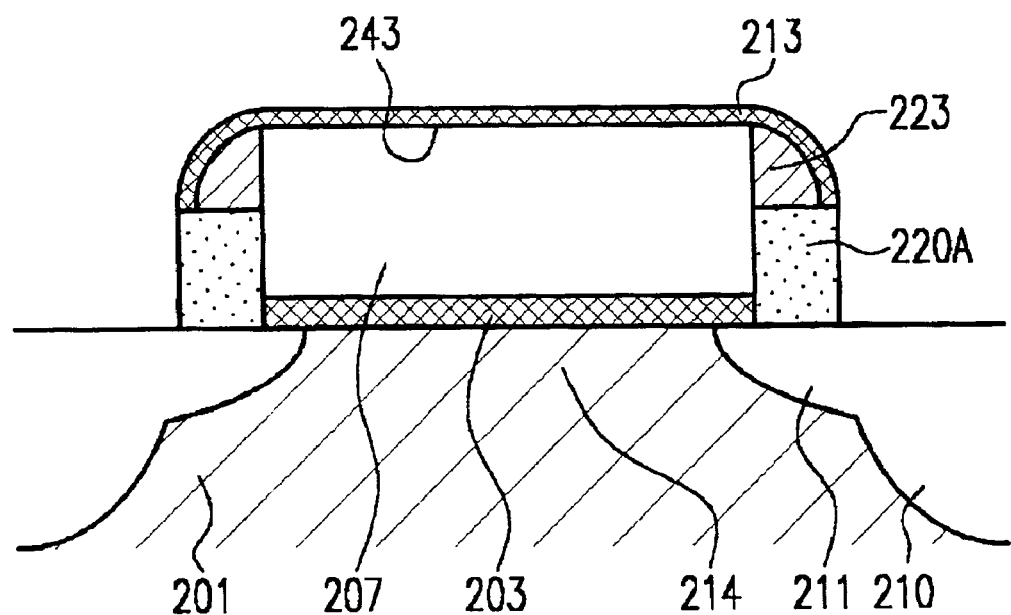

FIG. 2h schematically shows the transistor device 200 in a final manufacturing stage. On the top surface 243 of the gate electrode 242, a layer 213 of reduced electrical resistance is formed. In the present example, in accordance with standard CMOS processing, layer 213 of reduced electrical resistance is a cobalt silicide layer. Due to the increased surface area of the "T-shaped" gate electrode 242, and due to the increased cross-sectional area of the gate electrode, the gate sheet resistance, as well as the effective gate resistance, is significantly reduced compared to a typical prior art gate electrode. A typical prior art gate electrode using standard cobalt silicide would yield a sheet resistance of 8–9 ohm per square. The "T-shaped gate" leads typically to a reduced sheet resistance of 4–6 ohm per square, depending on the lateral extension of the gate electrode.

The reduced gate resistance results in a lower gate delay and, hence, in a smaller RC constant of the gate electrode which allows a higher operation speed of the transistor device.

Moreover, it should be noted that in the present embodiment, the first gate electrode material, i.e., the first portion 207, and the second gate electrode material are polycrystalline silicon. It is, however, possible to use different materials for the first portion 207 and the extension portions 223. For example, a metal, or a compound of a metal and silicon may be used as the second gate electrode material, e.g., the layer 204. Furthermore, it is possible to perform a silicidation step on the first portion 207 prior to the formation of the extension portions 223. The additional layer of reduced electrical resistance formed in the first portion 207 will further reduce the overall resistance of the gate electrode and, hence, improve signal performance of the FET.

Although the present invention is described with reference to a silicon substrate, a skilled person will readily appreciate that any appropriate substrate can be employed. For instance, the present invention is applicable to an SOI device (silicon-on-insulator) or to any other FET formed on any appropriate semiconductor substrate or insulating substrate.

Figure 3A:
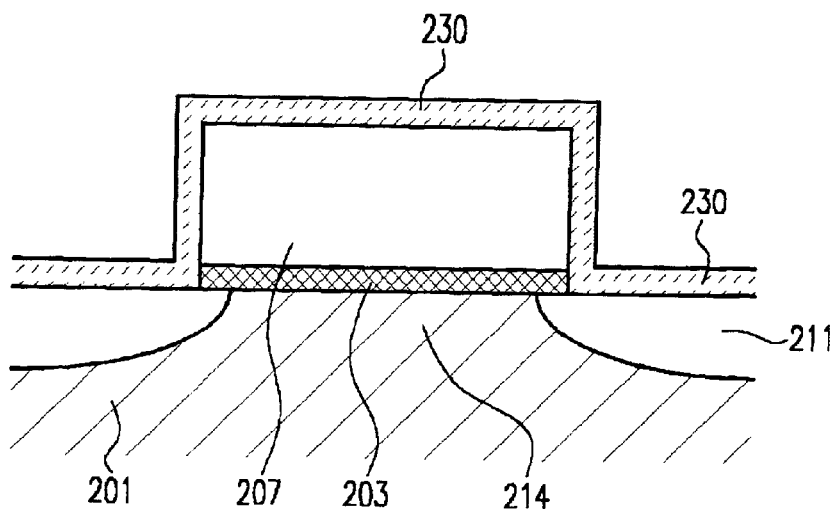
FIGS. 3a–3c show schematic cross-sectional views explaining an additional process step for improving control of the thickness of the insulating layer.
Figure 3B:
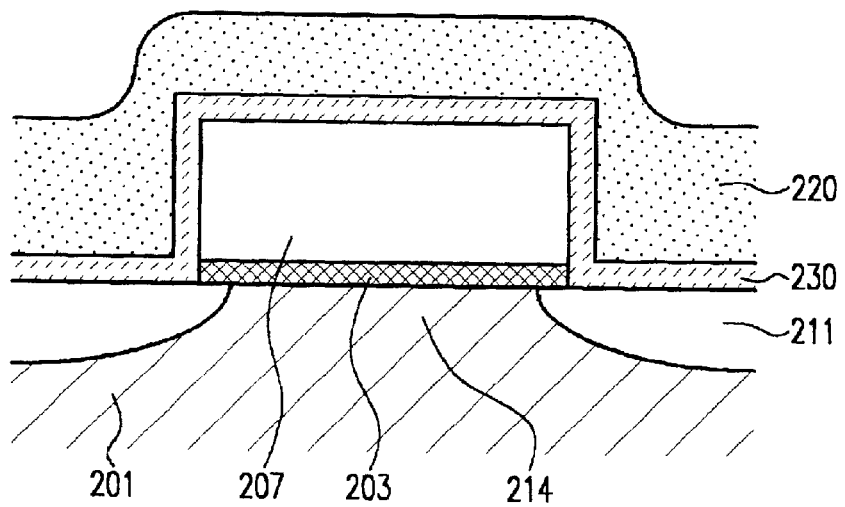
Figure 3C:
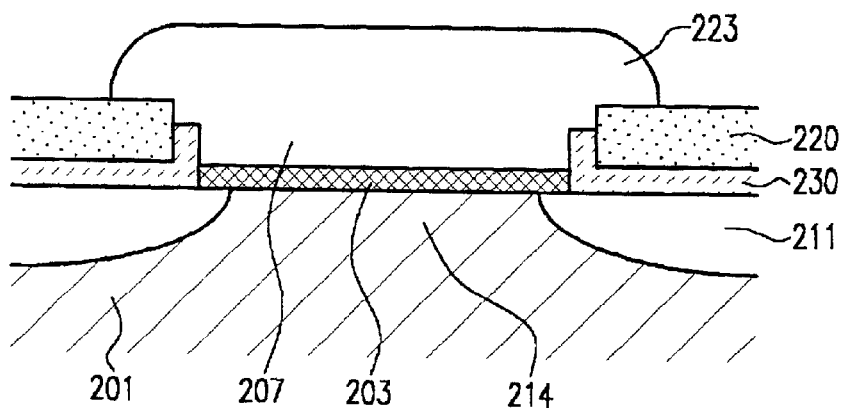

With reference to FIGS. 3a–3c, an additional method for improving thickness control of the insulating layer 220 is described. FIG. 3a schematically shows a cross-section of the transistor device 200 at the manufacturing stage prior to the deposition of the insulating layer 220. In FIG. 3a, the sidewalls 240 and the top surface 221 of the first portion 207, as well as the surface of the substrate are covered by an etch stop layer 230, which may be silicon dioxide that is thermally grown.

FIG. 3b shows the device of FIG. 3a with the insulating layer 220 covering the first portion 207 and the lightly doped drain and source regions 211. By providing the etch stop layer 230, which has a high selectivity to the material of the insulating layer 220 during a subsequent etch step, the final thickness of the insulating layer 220 is precisely adjustable. In the present example, the insulating layer 220 comprises silicon nitride and, hence, silicon nitride can be etched selectively to the polycrystalline silicon material of the first portion 207 and the silicon dioxide of the etch stop layer 230. After the polishing of the insulating layer 220, and the above-described selective etch step, the thermal oxide of the etch stop layer 230 at the exposed sidewall portion of the first portion 207 is removed for the subsequent formation of the extension portions 223.

FIG. 3c schematically shows a cross-sectional view of the device obtained by performing the process steps as described with reference to FIGS. 3a and 3b. The extension portions 223 are formed on the sidewalls 240 of the first portion 207 that are not covered by the etch stop layer 230. As in the previously described embodiment, the cross-sectional shape of the gate electrode is defined by the final thickness of the insulating layer 220.

It should be noted that other etch stop processes are applicable for defining the final thickness of the insulating layer 220. For example, combinations of different insulating layers may be used as the insulating layer 220 and different etching schemes corresponding to the stack of insulating layers may be employed. Moreover, the etch stop layer 230 may be formed by ion implantation to provide the required etch stop properties on corresponding surface portions of the structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor, comprising:
   a substrate;
   an active region defined in said substrate;
   a gate insulation layer formed above said active region;
   a gate electrode formed above said gate insulation layer, said gate elctrode having a middle portion located over the active region, said middle portion having an extension of an upper part along the gate length direction that decreases from bottom to top of the upper part, and said middle portion also having a gate length and a gate height, wherein a cross-sectional area of said gate electrode in a plane defined by said gate length and said gate height of the middle portion exceeds a value obtained by multiplying the gate length by the gate height; and
   a metal silicide layer formed on at least a portion of said gate electrode.

2. The transistor of claim 1, wherein a lower part of said middle portion has a cross-sectional area in the plane defined by the gate length and the gate height that is substantially rectangular.

3. The transistor of claim 1, wherein the gate length is 100 nm or less.

4. The transistor of claim 1, wherein sidewalls of the lower part are, at least partially, covered by thermally grown silicon dioxide.

5. The transistor of claim 1, wherein gate electrode comprises polycrystalline silicon and a metal.

6. The transistor of claim 1, wherein the upper part comprises a metal.

7. The transistor of claim 1, wherein the substrate is a semiconductor substrate.

8. The transistor of claim 1, wherein the substrate is an insulating substrate, and the active region is formed in a semiconductor layer deposited over the insulating substrate.

9. A transistor, comprising:
   a substrate;
   a gate insulation layer formed above said substrate;
   a gate electrode formed above said gate insulation layer, said gate electrode having an upper portion comprised of polysilicon and a lower portion, said upper portion having a plurality of metal extensions formed on said upper portion comprised of polysilicon, said metal extensions of said upper portion comprised of polysilicon extending laterally beyond said lower portion of said gate electrode by an amount that decreases from bottom to top of the upper portion; and
   a metal silicide layer formed on at least a portion of said gate electrode.

10. The transistor of claim 9, further comprising an insulating material positioned adjacent said lower portion of said gate electrode and under said extensions formed on said upper portion.

11. The transistor of claim 9, wherein said substrate is comprised of silicon.

12. The transistor of claim 9, wherein said gate insulation layer is comprised of silicon dioxide.

13. The transistor of claim 9, wherein said lower portion of said gate electrode is comprised of polysilicon.

14. The transistor of claim 9, wherein said extensions are comprised of polysilicon.

15. The transistor of claim 9, wherein said upper portion of said gate electrode and said extensions have a combined lateral dimension that is approximately 5–100 percent greater than a lateral dimension of said lower portion of said gate electrode.

16. A transistor, comprising:
   a substrate;
   a gate insulation layer formed above said substrate;
   a gate electrode formed above said gate insulation layer, said gate electrode comprised of a plurality of sidewalls, said gate electrode having an upper portion comprised of polysilicon and a lower portion, said upper portion having a plurality of extensions formed thereon, said extensions of said upper portion extending laterally beyond said lower portion of said gate electrode by an amount that decreases from bottom to top of the upper portion;
   an etch stop layer covering at least a portion of said sidewalls of said gate electrode; and a metal silicide layer formed on at least a portion of said gate electrode.

17. The transistor of claim 16, further comprising an insulating material positioned adjacent said lower portion of said gate electrode and under said extensions formed on said upper portion.

18. The transistor of claim 16, wherein said substrate is comprised of silicon.

19. The transistor of claim 16, wherein said gate insulation layer is comprised of silicon dioxide.

20. The transistor of claim 16, wherein said lower portion of said gate electrode is comprised of polysilicon.

21. The transistor of claim 16, wherein said extensions are comprised of polysilicon.

22. The transistor of claim 16, wherein said upper portion of said gate electrode and said extensions have a combined lateral dimension that is approximately 5–100 percent greater than a lateral dimension of said lower portion of said gate electrode.

23. The transistor of claim 16, wherein said etch stop layer is comprised of a thermally grown layer of silicon dioxide.

* * * * *

UNITED STATES PATENT AND TRADEMARK OFFICE
CERTIFICATE OF CORRECTION

PATENT NO. : 6,798,028 B2
DATED : September 28, 2004
INVENTOR(S) : Manfred Horstmann et al.

It is certified that error appears in the above-identified patent and that said Letters Patent is hereby corrected as shown below:

Column 8,
Line 47, "elctrode" should be -- electrode --.

Column 9,
Line 1, after "wherein" insert -- the --.

Signed and Sealed this

Twelfth Day of April, 2005

JON W. DUDAS
*Director of the United States Patent and Trademark Office*